(12) United States Patent
Yu et al.

(10) Patent No.: US 10,483,326 B2
(45) Date of Patent: Nov. 19, 2019

(54) IMAGE SENSOR AND MANUFACTURING METHOD THEREOF

(71) Applicant: INDUSTRIAL TECHNOLOGY RESEARCH INSTITUTE, Hsinchu (TW)

(72) Inventors: Sheng-Min Yu, Taoyuan (TW); Wen-Ching Sun, Hsinchu (TW); Pei-Wen Yen, New Taipei (TW); Yan-Rung Lin, Hsinchu (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 0 days.

(21) Appl. No.: 15/850,809

(22) Filed: Dec. 21, 2017

(65) Prior Publication Data

US 2019/0074326 A1    Mar. 7, 2019

(30) Foreign Application Priority Data

Sep. 6, 2017    (TW) .............................. 106130517 A (51) Int. Cl.
*H01L 27/30* (2006.01)
*H01L 51/42* (2006.01)
*H01L 51/00* (2006.01)

(52) U.S. Cl.
CPC ........ *H01L 27/307* (2013.01); *H01L 51/0015* (2013.01); *H01L 51/0026* (2013.01); *H01L 51/4206* (2013.01)

(58) Field of Classification Search
CPC ......... G02F 1/136209; G02F 1/133512; H01L 27/307; H01L 51/0026; H01L 51/0015; H01L 51/4206
See application file for complete search history.

(56) References Cited

U.S. PATENT DOCUMENTS 8,232,616 B2    7/2012    Maehara et al.
9,209,331 B2    12/2015    Ivanov et al.
(Continued)

FOREIGN PATENT DOCUMENTS

CN    105428384 A    3/2016
TW    201405790 A    2/2014
(Continued)

OTHER PUBLICATIONS

Fontaine, "The State-of-the-Art of Mainstream CMOS Image Sensors", 2015, 4 pages.
(Continued)

*Primary Examiner* — Mohammed R Alam
(74) *Attorney, Agent, or Firm* — Muncy, Geissler, Olds & Lowe, P.C.

(57) ABSTRACT

An image sensor and a manufacturing method thereof are provided. The image sensor includes a substrate, a patterned electrode layer, a pixel isolation structure and a patterned photo-electric conversion layer. The patterned electrode layer is disposed on the substrate and includes a plurality of electrode blocks separated from one another. The pixel isolation structure is disposed on the substrate and includes a metal halide. The patterned photo-electric conversion layer is disposed on the electrode blocks to form a plurality of photo-electric conversion blocks corresponding to the electrode blocks. The photo-electric conversion blocks include a perovskite material. The photo-electric conversion blocks are separated from one another by the pixel isolation structure.

8 Claims, 11 Drawing Sheets

(56) References Cited

U.S. PATENT DOCUMENTS

| | | |
|---|---|---|
| 9,293,487 B2 | 3/2016 | Tian et al. |
| 9,343,492 B2 | 5/2016 | Jin et al. |
| 9,343,502 B2 | 5/2016 | Kim et al. |
| 2001/0030279 A1* | 10/2001 | Zhang ............... H01L 27/14603 250/214.1 |
| 2007/0075253 A1 | 4/2007 | Misawa et al. |
| 2007/0076093 A1 | 4/2007 | Misawa |
| 2009/0127599 A1 | 5/2009 | Kim et al. |
| 2010/0060769 A1 | 3/2010 | Inuiya |
| 2011/0025899 A1 | 2/2011 | Schmaelzle et al. |
| 2011/0277818 A1* | 11/2011 | Shimura ............... H01G 9/2068 136/246 |
| 2012/0032168 A1* | 2/2012 | Cho ................... H01L 31/0352 257/49 |
| 2015/0187844 A1 | 7/2015 | Lee et al. |
| 2016/0035917 A1 | 2/2016 | Gershon et al. |
| 2017/0186788 A1 | 6/2017 | Yen et al. |
| 2017/0186818 A1 | 6/2017 | Yen et al. |

FOREIGN PATENT DOCUMENTS

| | | |
|---|---|---|
| TW | 201507186 A | 2/2015 |
| TW | 201603307 A | 3/2016 |

OTHER PUBLICATIONS

Chen et al., "Under the spotlight: The organic—inorganic hybrid halide perovskite for optoelectronic applications", Nano Today, 2015, vol. 10, pp. 355-396.

Gu et al., "Direct-Writing Multifunctional Perovskite Single Crystal Arrays by Inkjet Printing", Small, vol. 13, 2017, 7 pages.

Waleed et al., "Lead-Free Perovskite Nanowire Array Photodetectors with Drastically Improved Stability in Nanoengineering Templates", Nano Lett, 2017, vol. 17, pp. 523-530.

Wang et al., "Wafer-scale growth of large arrays of perovskite microplate crystals for functional electronics and optoelectronics", Sci. Adv., Oct. 2, 2015, 8 pages.

Chou et al., "Laser Direct Write Synthesis of Lead Halide Perovskites", J. Phys. Chem. Lett. 2016, vol. 7, pp. 3736-3741.

Chen et al., "Controllable Self-Induced Passivation of Hybrid Lead Iodide Perovskites toward High Performance Solar Cells", Nano. Lett., 2014, vol. 14, pp. 4158-4163.

* cited by examiner

IMAGE SENSOR AND MANUFACTURING METHOD THEREOF

This application claims the benefit of Taiwan application Serial No. 106130517, filed Sep. 6, 2017, the subject matter of which is incorporated herein by reference.

BACKGROUND OF THE INVENTION

Field of the Invention

The invention relates in general to an image sensor and a manufacturing method thereof.

Description of the Related Art

Over the years, the industries have focused on the development of sensing element with high sensibility to assure that the image sensing chip (CMOS image sensor) has satisfactory performance even when the ambient light is insufficient.

However, a light sensing element is normally formed of silicon. When the number of pixels is largely increased to achieve a higher resolution level within the same chip area, the pixel size is downsized, and both the amount of incident light and the light area per pixel are reduced. The perovskite material, having the advantages of low cost, simple manufacturing process, high response, high detection rate and high response rate, is an ideal material for the light sensing layer used in the image sensing chip. In practical application of image processing, the perovskite material must form a pixel structure. Since the perovskite material has a high carrier mobility and a long length of carrier diffusion, crosstalk will occur due to the interaction of electric signals between pixels and will generate negative influence on image quality.

Based on the above reasons, despite the semiconductor manufacturing process continually advancing, the pixel size of the sensing element cannot be reduced further, and the number of pixels cannot be increased either. Under such circumstance, the resolution level of the image sensing chip can hardly be increased. Therefore, how to increase the efficiency of light sensing element has become not only a prominent task for the industries but also a current focus in the development of image sensing element.

SUMMARY OF THE INVENTION

The invention is directed to an image sensor and a manufacturing method thereof. In an embodiment, the patterned photo-electric conversion layer of the image sensor includes a perovskite material having high photo-electric conversion abilities, and the pixel isolation structure of the image sensor includes a metal halide having high resistance. Therefore, even when the perovskite material of the patterned photo-electric conversion layer provides very high carrier mobility, the metal halide of the pixel isolation structure is still capable of effectively blocking the diffusion currents between the photo-electric conversion blocks to reduce the crosstalk phenomenon between pixels and increase the quality of image sensing.

According to one embodiment of the invention, an image sensor is provided. The image sensor includes a substrate, a patterned electrode layer, a pixel isolation structure and a patterned photo-electric conversion layer. The patterned electrode layer is disposed on the substrate and includes a plurality of electrode blocks separated from one another. The pixel isolation structure is disposed on the substrate and includes a metal halide. The patterned photo-electric conversion layer is disposed on the electrode blocks to form a plurality of photo-electric conversion blocks corresponding to the electrode blocks. The photo-electric conversion blocks include a perovskite material. The photo-electric conversion blocks are separated from one another by the pixel isolation structure.

According to another embodiment of the invention, a manufacturing method of an image sensor is provided. The manufacturing method of the image sensor includes following steps: providing a substrate; forming a patterned electrode layer on the substrate, wherein the patterned electrode layer includes a plurality of electrode blocks separated from one another; forming a metal halide layer on the electrode blocks and the substrate, wherein the metal halide layer includes a first metal halide layer formed on the electrode blocks and a second metal halide layer formed on the substrate; and providing an organic halide layer contacting the first metal halide layer and performing a solid state reaction with the first metal halide layer to convert the first metal halide layer into a patterned photo-electric conversion layer on the patterned electrode layer, wherein the patterned photo-electric conversion layer includes a perovskite material.

According to an alternative embodiment of the invention, a manufacturing method of an image sensor is provided. The manufacturing method of the image sensor includes following steps: providing a substrate; forming a patterned electrode layer on the substrate, wherein the patterned electrode layer includes a plurality of electrode blocks separated from one another and embedded on the substrate; forming a metal halide layer on the patterned electrode layer and the substrate, wherein the metal halide layer includes a first metal halide layer formed on the electrode blocks and a second metal halide layer formed on the substrate; and providing a patterned organic halide layer contacting the metal halide layer and performing a solid state reaction with the first metal halide layer to convert the first metal halide layer into a patterned photo-electric conversion layer on the patterned electrode layer, wherein the patterned photo-electric conversion layer includes a perovskite material.

The above and other aspects of the invention will easily understand with regard to the following detailed description of the preferred but non-limiting embodiment(s). The following description is made with reference to the accompanying drawings.

DETAILED DESCRIPTION OF THE INVENTION

In an embodiment of the present disclosure, the patterned photo-electric conversion layer of the image sensor includes a perovskite material having high photo-electric conversion abilities, and the pixel isolation structure of the image sensor includes a metal halide having high resistance. Therefore, even when the perovskite material of the patterned photo-electric conversion layer provides very high carrier mobility, the metal halide of the pixel isolation structure is still capable of effectively blocking the diffusion currents between the photo-electric conversion blocks to reduce the crosstalk phenomenon between pixels and increase the quality of image sensing. Details of the embodiments of the present disclosure are disclosed below. Detailed structures and steps disclosed in the embodiments are exemplary and explanatory purposes only, not for limiting the scope of protection of the present disclosure. Anyone skilled in the technology field of the invention will be able to make suitable modifications or changes based on the needs in actual implementations.

Figure 1:
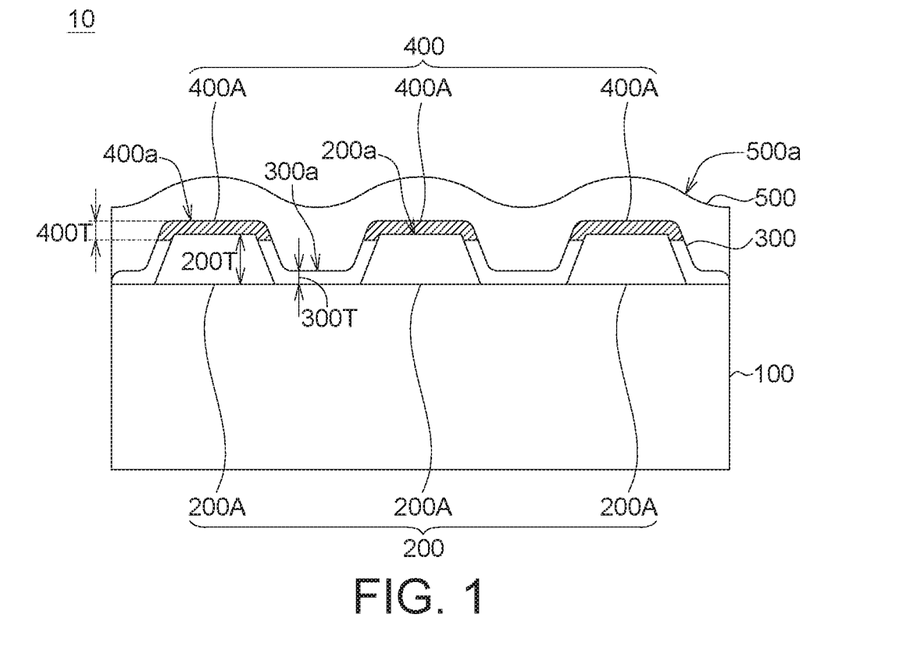
FIG. 1 is a schematic diagram of an image sensor according to an embodiment of the present disclosure.

FIG. 1 is a schematic diagram of an image sensor according to an embodiment of the present disclosure. As indicated in FIG. 1, the image sensor 10 includes a substrate 100, a patterned electrode layer 200, a pixel isolation structure 300 and a patterned photo-electric conversion layer 400. The patterned electrode layer 200 is disposed on the substrate 100 and includes a plurality of electrode blocks 200A separated from one another. The pixel isolation structure 300 is disposed on the substrate 100, includes a metal halide and separates the electrode blocks 200A from one another. The patterned photo-electric conversion layer 400 is disposed on the patterned electrode blocks 200A to form a plurality of photo-electric conversion blocks 400A corresponding to the patterned electrode blocks 200A, and the photo-electric conversion blocks 400A of the patterned photo-electric conversion layer 400 include a perovskite material. As indicated in FIG. 1, the photo-electric conversion blocks 400A are separated from one another by the pixel isolation structure 300.

Conventionally, the light sensing material is formed of silicon. Since silicon has a lower absorption coefficient, the silicon light sensing layer needs to have a thickness of at least 2 μm to generate a sufficient light sensing effect. Given that the pixel width has been gradually reduced to be even smaller than 1.5 μm over the years, a silicon light sensing layer having a larger thickness may easily generate a crosstalk phenomenon of light signals when the angle of incident light is too inclined. According to an embodiment of the present disclosure, the patterned photo-electric conversion layer 400 includes a perovskite material whose absorption coefficient is 10 times larger than silicon. Therefore, the perovskite material can form a thinned light sensing layer to avoid the crosstalk phenomenon of light signal between pixels which occurs when the angle of incident light is inclined too much. Moreover, the perovskite material has an energy gap of 1.6 eV and an absorption wavelength range smaller than 800 nm, and therefore will not be interfered with by infra-red light signals.

According to an embodiment of the present disclosure, the patterned photo-electric conversion layer 400 includes a perovskite material having high photo-electric conversion abilities, and the pixel isolation structure 300 includes a metal halide having very high carrier mobility. Therefore, even when the perovskite material of the patterned photo-electric conversion layer 400 provides very high carrier mobility, the metal halide of the pixel isolation structure 300 is still capable of blocking the diffusion currents between the photo-electric conversion blocks 400A to reduce the crosstalk phenomenon between pixels and increase the quality of image sensing. Moreover, the energy gap of the metal halide (for example, lead iodide has an energy gap of 2.3 eV) is larger than the energy gap of the perovskite material (for example, methyl ammonium lead iodide has an energy gap of 1.6 eV). Since the energy gap can effectively block the transmission and transition of electrons, the metal halide of the pixel isolation structure 300 can provide excellent pixel isolation effect.

In some embodiments, the metal halide can be represented by a formula as follows: $(MX_2)_a(AMX_3)_b(B_2MX_4)_c$, wherein "A" denotes a positive monovalent metal cation (such as lithium ion, sodium ion, potassium ion, rubidium ion, cesium ion or a combination thereof) or a positive monovalent organic cation (such as R—$NH_3$ cation), wherein R is an alkyl group having 1-3 carbon atoms; "B" denotes an R1-$NH_3$ cation, wherein R1 is an alkyl group having 4-18 carbon atoms; "M" denotes a positive bivalent metal cation (such as lead ion, tin ion, bismuth ion, nickel ion, copper ion or a combination thereof); "X" denotes a halogen (such as fluorine, chlorine, bromine, iodine or a combination thereof); and a>b+c. That is, the metal halide $((MX_2)_a)$ occupies more than 50% of the total material $((MX_2)_a(AMX_3)_b(B_2MX_4)_c)$ of the pixel isolation structure 300.

In some embodiments, the perovskite material can be represented by a formula as follows: $(AMX_3)_{1-n}(B_2MX_4)_n$, wherein "A" denotes a positive monovalent metal cation or a positive monovalent organic cation; "B" denotes an R1-$NH_3$ cation, wherein R1 is an alkyl group having 4-18 carbon atoms; "M" denotes a positive bivalent metal cation; "X" denotes a halogen, and n=0-1. In other words, the patterned photo-electric conversion layer 400 is substantially formed of the perovskite material.

The results illustrated in Table 1 are obtained from an experimental design where the metal halide is exemplified by lead iodide ($PbI_2$) and the perovskite material is exemplified by methyl ammonium lead iodide ($CH_3NH_3PbI_3$), and a mixture of lead iodide and methyl ammonium lead iodide is coated on an ITO substrate having a size of 0.25 cm×0.25 cm and a thickness of 300 nm, wherein the mixture is formed of different ratios of lead iodide and methyl ammonium lead iodide. Then, the surface of the ITO substrate is electro-plated with gold, a current of the coating film is measured using a 3V bias and then the current is converted into a resistance. Measurements of the current and the resistance are illustrated in Table 1.

TABLE 1

| Mixture ratio | Current (pA) | Resistance (ohm) |
| --- | --- | --- |
| 100% lead iodide | 44 | 6.82E+09 |
| 75% lead iodide + 25% methyl ammonium lead iodide | 158 | 1.90E+09 |

TABLE 1-continued

| Mixture ratio | Current (pA) | Resistance (ohm) |
| --- | --- | --- |
| 50% lead iodide + 50% methyl ammonium lead iodide | 12089 | 2.48E+07 |
| 25% lead iodide + 75% methyl ammonium lead iodide | 19498 | 1.54E+07 |
| 100% methyl ammonium lead iodide | 30807 | 9.74E+06 |

As indicated in Table 1, when lead iodide occupies more than 50% of the constitution of the coating film, the resistance of the coating film will be significantly increased by at least two magnitudes. In other words, the results illustrated in Table 1 further confirm that, according to an embodiment of the present disclosure, when the metal halide $((MX_2)_a)$ occupies more than 50% (a>b+c) of material $((MX_2)_a(AMX_3)_b(B_2MX_4)_c)$ of the pixel isolation structure 300, this shows that the pixel isolation structure 300 has high resistance and therefore can effectively block the diffusion currents between the photo-electric conversion blocks 400A to effectively reduce the crosstalk phenomenon between pixels and increase the quality of image sensing.

Figure 2:
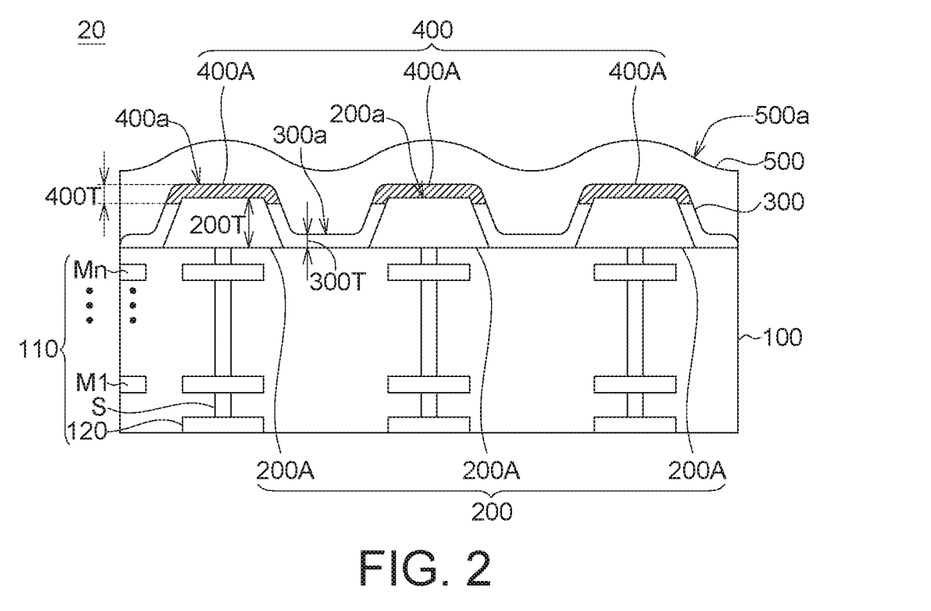
FIG. 2 is a schematic diagram of an image sensor according to another embodiment of the present disclosure.

FIG. 2 is a schematic diagram of an image sensor according to another embodiment of the present disclosure. For elements of the present embodiments similar or identical to that of previous embodiment, similar or identical designations are used to indicate similar or identical elements. Relevant descriptions of similar or identical elements can be obtained from above disclosure.

In an embodiment as indicated in FIG. 2, the patterned electrode layer 200 has a thickness 200T of 400-500 nm, the pixel isolation structure 300 has a thickness 300T of 200-300 nm, and the patterned photo-electric conversion layer 400 has a thickness 400T of 200-300 nm.

In an embodiment, the patterned electrode layer 200, such as a conductive metal layer, may include aluminum, copper, silver, gold, platinum or any combination thereof.

In an embodiment as indicated in FIG. 2, the image sensor 20 further includes an electrode layer 500 disposed on the patterned photo-electric conversion layer 400 and the pixel isolation structure 300. In an embodiment, the electrode layer 500, such as a transparent electrode layer, may include indium tin oxide (ITO), indium zinc oxide (IZO), tin oxide (SnO), tin oxide (ATO), aluminum oxide (AZO), fluorine doped tin oxide (FTO) or any combination thereof.

In some embodiments as indicated in FIG. 2, the top surface 400a of a plurality of photo-electric conversion blocks 400A of the patterned photo-electric conversion layer 400 is located higher than the top surface 300a of the pixel isolation structure 300. In some embodiments as indicated in FIG. 2, the top surface 200a of the patterned electrode layer 200 is located higher than the top surface 300a of the pixel isolation structure 300. In other words, the top surface 400a of the photo-electric conversion blocks 400A and the top surface 300a of the pixel isolation structure 300 form an uneven top surface, and the electrode layer 500 formed thereon is conformal with the photo-electric conversion blocks 400A of the patterned photo-electric conversion layer 400 and the overall top surface of the pixel isolation structure 300. Therefore, the electrode layer 500 has an uneven top surface 500a.

In some embodiments as indicated in FIG. 2, the substrate 100 may include a pixel sensing circuit 110. In an example as indicated in FIG. 2, the pixel sensing circuit 110 may include an electronic device 120, metal layers M1-Mn, contact vias S, an amplifier, and so on. For example, the electronic device 120 can be realized by a transistor of a readout circuit, the metal layers M1-Mn may include an electronic device such as a capacitor, and the contact vias S can be used as signal channels, but the present disclosure is not limited thereto. In an embodiment, the patterned electrode layer 200 is electrically connected to the pixel sensing circuit 110 via a contact hole.

Figure 3:
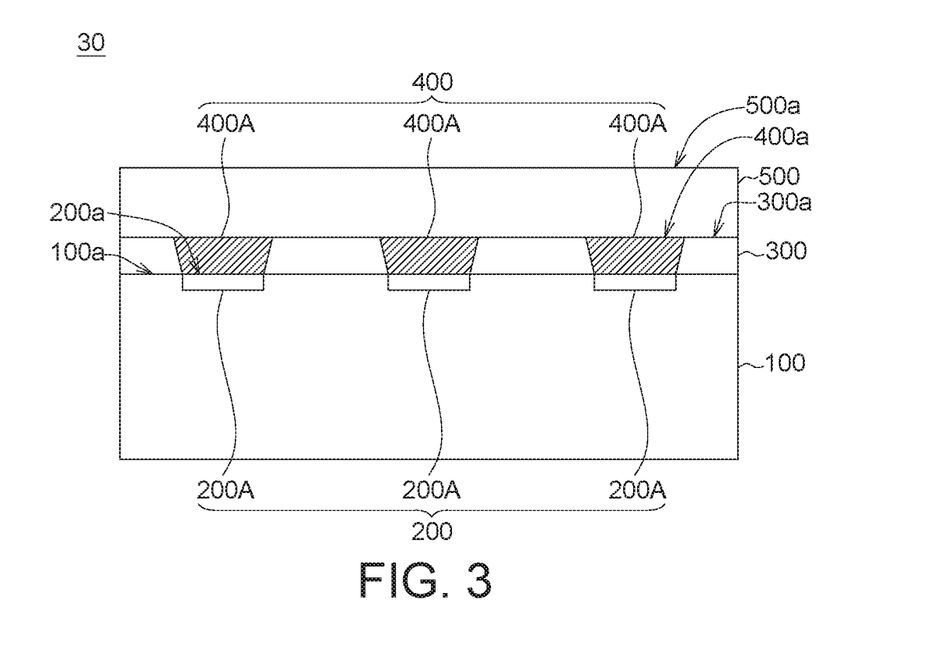
FIG. 3 is a schematic diagram of an image sensor according to another embodiment of the present disclosure.

FIG. 3 is a schematic diagram of an image sensor according to another embodiment of the present disclosure. For elements of the present embodiments similar or identical to that of previous embodiment, similar or identical designations are used to indicate similar or identical elements. Relevant descriptions of similar or identical elements can be obtained from above disclosure.

As indicated in FIG. 3, of the image sensor 30, the top surface 400a of the patterned photo-electric conversion layer 400 and the top surface 300a of the pixel isolation structure 300 are coplanar. In some embodiments as indicated in FIG. 3, the top surface 200a of the patterned electrode layer 200 is lower than the top surface 300a of the pixel isolation structure 300.

As indicated in FIG. 3, of the image sensor 30, the electrode blocks 200A of the patterned electrode layer 200 are embedded on the substrate 100. In an embodiment as indicated in FIG. 3, the top surface 200a of the electrode blocks 200A (the top surface 200a of the patterned electrode layer 200) and the top surface 100a of the substrate 100 are coplanar.

In some embodiments as indicated in FIG. 3, the top surface 400a of the patterned photo-electric conversion layer 400 and the top surface 300a of the pixel isolation structure 300 form a planarized top surface, and the electrode layer 500 formed thereon also has a planarized top surface 500a.

Figure 4:
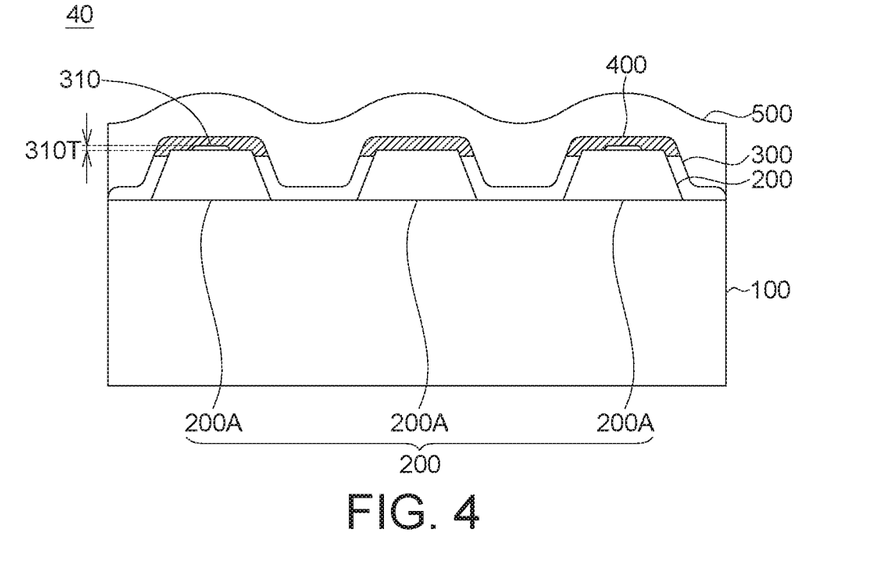
FIG. 4 is a schematic diagram of an image sensor according to an alternative embodiment of the present disclosure.
Figure 5:
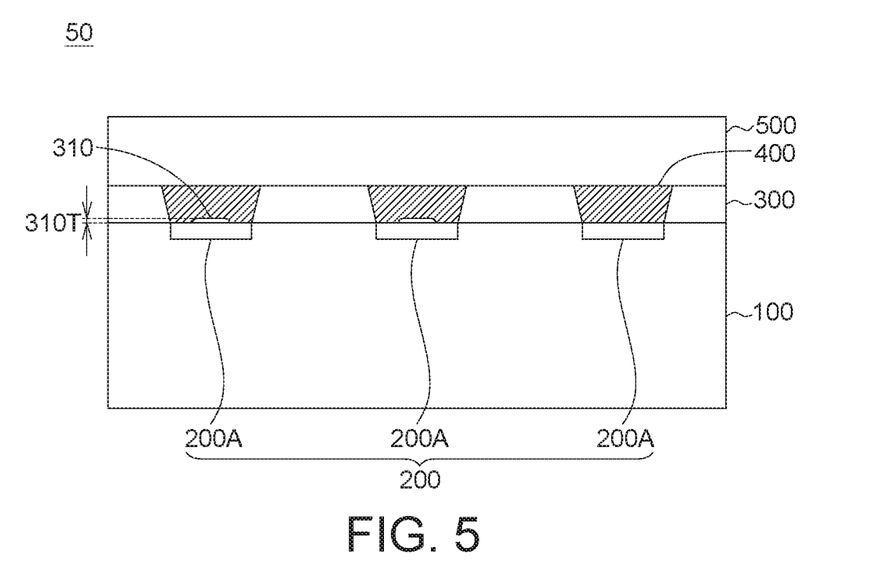
FIG. 5 is a schematic diagram of an image sensor according to another alternative embodiment of the present disclosure.

FIG. 4 is a schematic diagram of an image sensor according to an alternative embodiment of the present disclosure. FIG. 5 is a schematic diagram of an image sensor according to another alternative embodiment of the present disclosure. For elements of the present embodiments similar or identical to that of previous embodiment, similar or identical designations are used to indicate similar or identical elements. Relevant descriptions of similar or identical elements can be obtained from above disclosure.

The difference between the image sensor 40 of FIG. 4 and the image sensor 10 of FIG. 1 and the difference between the image sensor 50 of FIG. 5 and the image sensor 30 of FIG. 3 mainly lie in that the image sensor 40/50 may further include a metal halide film 310 disposed on the photo-electric conversion blocks 400A and interposed between the photo-electric conversion blocks 400A and the electrode blocks 200A, and the metal halide film 310 has a thickness 310T smaller than 10 nm.

In an embodiment, the metal halide film 310 is substantially formed of the same material as the pixel isolation structure 300. Normally, due to incomplete reaction in the manufacturing process, the metal halide film 310 is formed of the part of the metal halide which is not fully reacted for forming the patterned photo-electric conversion layer. Although the metal halide film 310 has high resistance, the metal halide film 310, having a thickness 310T smaller than 10 nm and only occupying a local region interposed between the patterned photo-electric conversion layer 400 and the patterned electrode layer 200 as indicated in FIG. 4-5, will not significantly affect the operating performance of the image sensor but only slightly increase the operating voltage of the image sensor.

Figure 6:
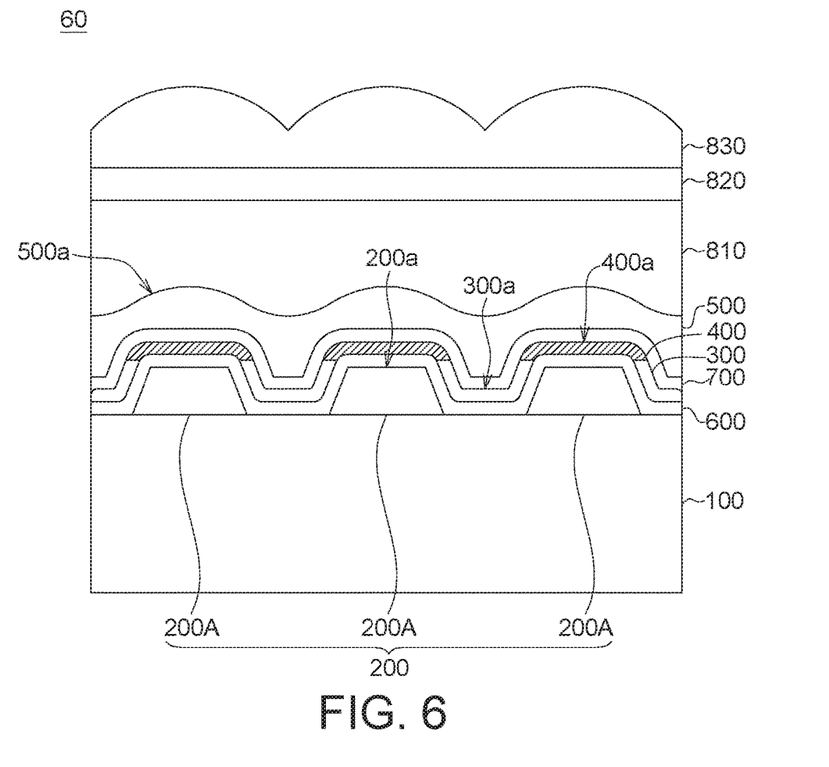
FIG. 6 is a schematic diagram of an image sensor according to further another alternative embodiment of the present disclosure.

FIG. 6 is a schematic diagram of an image sensor according to further another alternative embodiment of the present disclosure. For elements of the present embodiments similar or identical to that of previous embodiment, similar or identical designations are used to indicate similar or identical elements. Relevant descriptions of similar or identical elements can be obtained from above disclosure.

In some embodiments as indicated in FIG. 6, the image sensor 60 further optionally includes a first buffer layer 600 and/or a second buffer layer 700. As indicated in FIG. 6, the first buffer layer 600 is disposed on the patterned electrode layer 200, and the patterned photo-electric conversion layer 400 is disposed on the first buffer layer 600. As indicated in FIG. 6, the second buffer layer 700 is disposed on the patterned photo-electric conversion layer 400, and the electrode layer 500 is disposed on the second buffer layer 700.

In an embodiment, the first buffer layer 600 and/or the second buffer layer 700 helps to reduce leakage current. In some embodiments, the first buffer layer 600 and the second buffer layer 700 may independently include titanium oxide ($TiO_2$) and/or alumina ($Al_2O_3$).

In an embodiment as indicated in FIG. 6, the top surface of the substrate 100 and the top surface 200a of the patterned electrode layer 200 form an uneven top surface, and the first buffer layer 600 formed thereon is conformal with the overall top surface of the patterned electrode layer 200 and the substrate 100. In an embodiment as indicated in FIG. 6, the top surface 400a of the patterned photo-electric conversion layer 400 and the top surface 300a of the pixel isolation structure 300 form an uneven top surface, and the second buffer layer 700 formed thereon is conformal with the overall top surface of the patterned photo-electric conversion layer 400 and the pixel isolation structure 300. In an embodiment as indicated in FIG. 6, the electrode layer 500 is conformal with the second buffer layer 700 and has an uneven top surface 500a.

In some embodiments as indicated in FIG. 6, the image sensor 60 further optionally includes a planarization layer 810, a color filter layer 820 and/or a lens layer 830. In an embodiment as indicated in FIG. 6, the planarization layer 810 is disposed on the electrode layer 500, the color filter layer 820 is disposed on the planarization layer 810, and the lens layer 830 is disposed on the color filter layer 820.

In an embodiment as indicated in FIG. 6, when the electrode layer 500 is conformal with the overall top surface of the patterned photo-electric conversion layer 400 and the pixel isolation structure 300 and has an uneven top surface 500a, the planarization layer 810 is formed on the electrode layer 500, such that subsequent films can be formed on a planarized surface. The lens layer 830 helps to condense the lights of large angles to the photo-electric conversion blocks of corresponding pixels, and is capable of condensing the lights and increasing the efficiency of light sensing.

Figure 7:
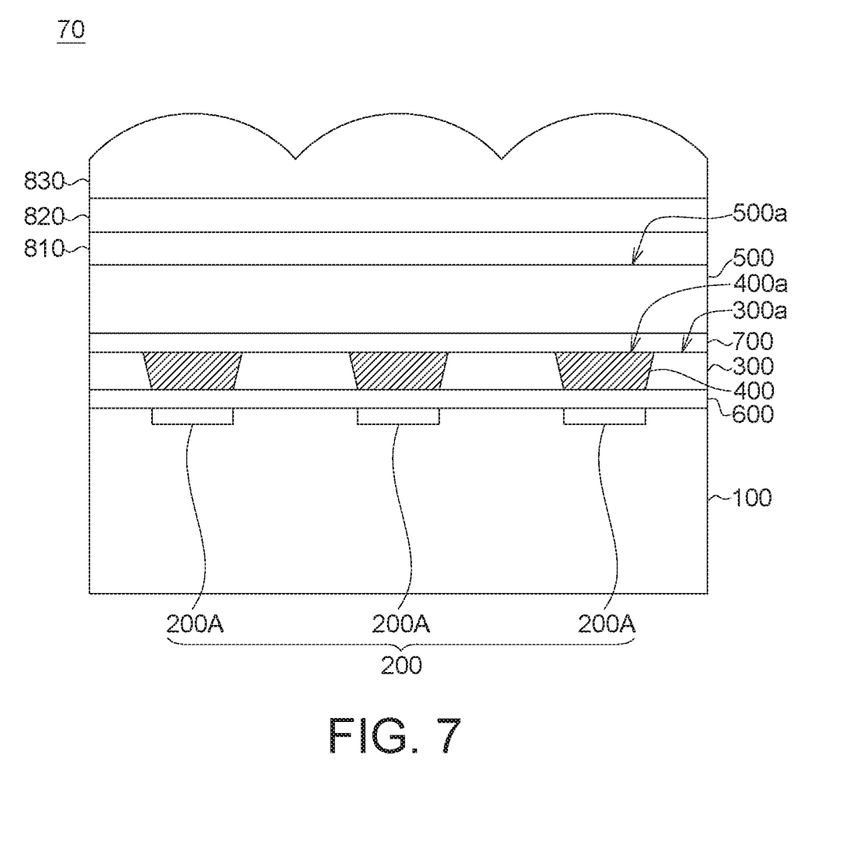
FIG. 7 is a schematic diagram of an image sensor according to one more alternative embodiment of the present disclosure.

FIG. 7 is a schematic diagram of an image sensor according to one more alternative embodiment of the present disclosure. For elements of the present embodiments similar or identical to that of previous embodiment, similar or identical designations are used to indicate similar or identical elements. Relevant descriptions of similar or identical elements can be obtained from above disclosure.

The difference between the image sensor 70 of FIG. 7 and the image sensor 60 of FIG. 6 is similar to the difference between the image sensor 30 of FIG. 3 and the image sensor 10 of FIG. 1. As indicated in FIG. 7, the main difference lies in that the top surface 400a of the patterned photo-electric conversion layer 400 and the top surface 300a of the pixel isolation structure 300 form a planarized top surface, and the electrode layer 500 formed thereon also has a planarized top surface 500a.

In some embodiments as indicated in FIG. 7, the image sensor 70 further optionally includes a first buffer layer 600, a second buffer layer 700, a planarization layer 810, a color filter layer 820 and/or a lens layer 830. As indicated in FIG. 7, the first buffer layer 600 and the second buffer layer 700 both have planarized top surfaces.

FIGS. 8A-8E are schematic diagrams of a manufacturing method of an image sensor according to an embodiment of the present disclosure. For elements of the present embodiments similar or identical to that of previous embodiment, similar or identical designations are used to indicate similar or identical elements. Relevant descriptions of similar or identical elements can be obtained from above disclosure.

Figure 8A:
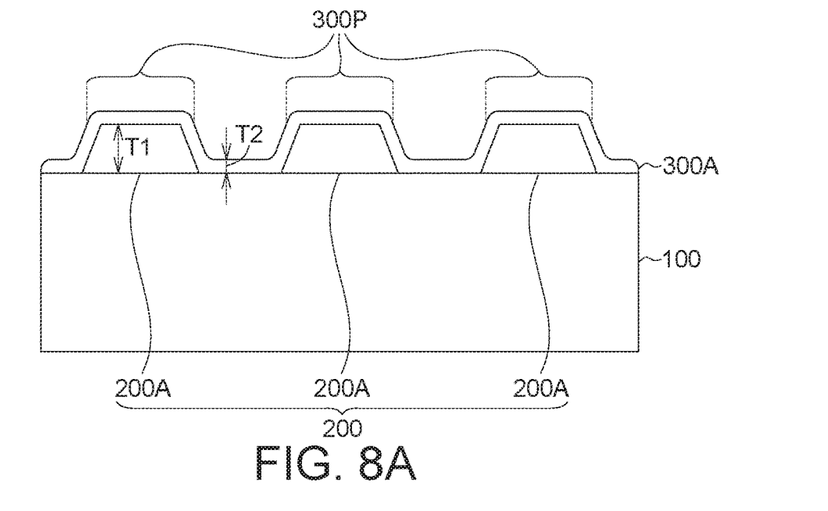
FIGS. 8A-8E are schematic diagrams of a manufacturing method of an image sensor according to an embodiment of the present disclosure.

Referring to FIG. 8A, a substrate 100 is provided, and a patterned electrode layer 200 is formed on the substrate 100, wherein the patterned electrode layer 200 includes a plurality of electrode blocks 200A. In an embodiment, the patterned electrode layer 200 has a first thickness T1. In an embodiment, the first thickness T1 is 400 nm-500 nm.

Moreover, as indicated in FIG. 8A, a metal halide layer is formed on the electrode blocks 200A and the substrate 100. In an embodiment, the metal halide layer includes a first metal halide layer 300P formed on the electrode blocks 200A and a second metal halide layer 300A formed on the substrate 100. In an embodiment, the first metal halide layer 300P and the second metal halide layer 300A of the metal halide layer both have a second thickness T2. In an embodiment, the second thickness T2 is 200 nm-300 nm and is smaller than the first thickness T1.

Specifically, the metal halide layer may be evaporated on the top surface 200a of the patterned electrode layer 200 and the surface of the substrate 100. Since the patterned electrode layer 200 includes a plurality of electrode blocks 200A, a part of the metal halide layer on the top surface 200a of each electrode block 200A forms a first metal halide layer 300P whose pattern is substantially the same as the pattern of a plurality of electrode blocks 200A.

In an embodiment as indicated in FIG. 8A, the substrate 100 may include a pixel sensing circuit 110 (not shown), wherein the step of providing the substrate 100 may further include manufacturing the pixel sensing circuit 110 whose process temperature is higher than 150° C. According to an embodiment of the present disclosure, the step of manufacturing the pixel sensing circuit 110 is performed before the subsequent step of forming the patterned photo-electric conversion layer by a solid state reaction is performed.

Figure 8B:
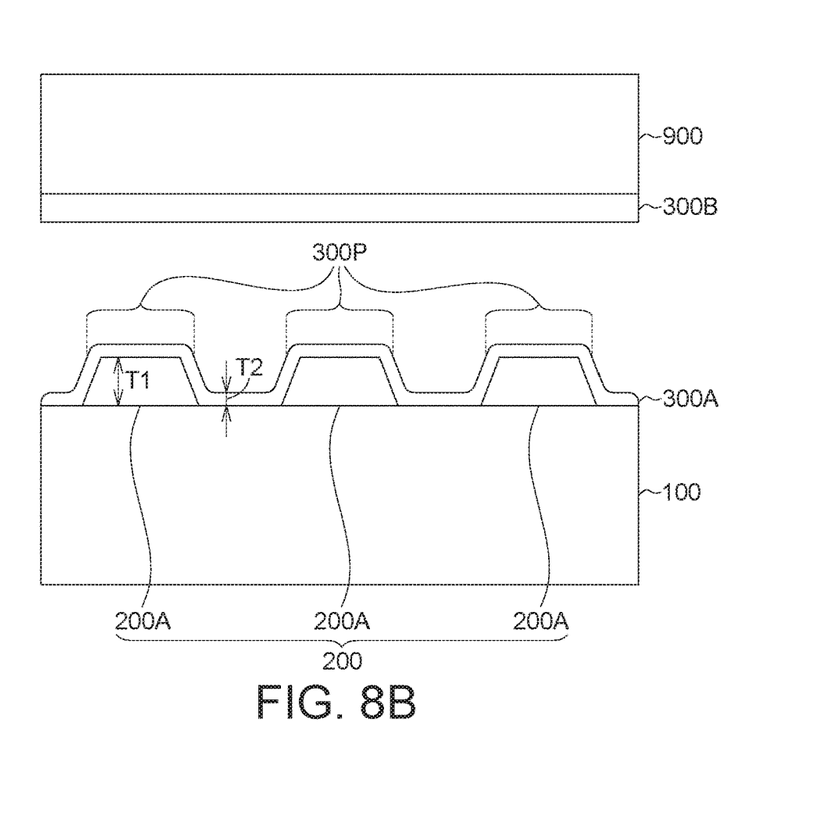

Then, as indicated in FIG. 8B, an organic halide layer 300B is provided. In an embodiment, the organic halide layer 300B is formed on a planarized surface of a substrate 900 such as a silicon substrate.

Figure 8C:
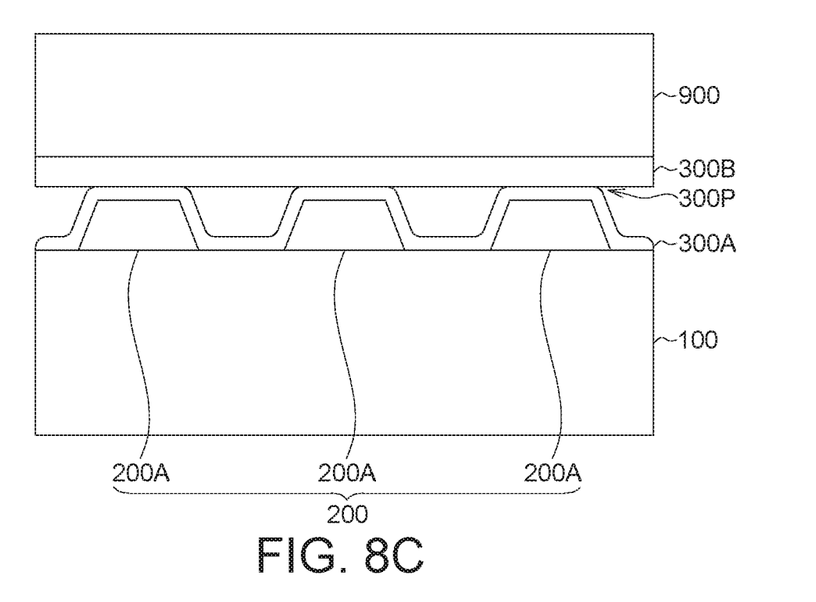

Then, as indicated in FIG. 8C, the organic halide layer 300B contacts the first metal halide layer 300P and performs a solid state reaction with the first metal halide layer 300P.

In some embodiments, the solid state reaction is performed at a heating temperature of 90-140° C. for a reaction time of 10-120 minutes. In some embodiments, the solid state reaction is performed at a heating temperature of 100-120° C. for a reaction time of 60-100 minutes. In some embodiments, the solid state reaction can be performed in the air or under vacuum.

Figure 8D:
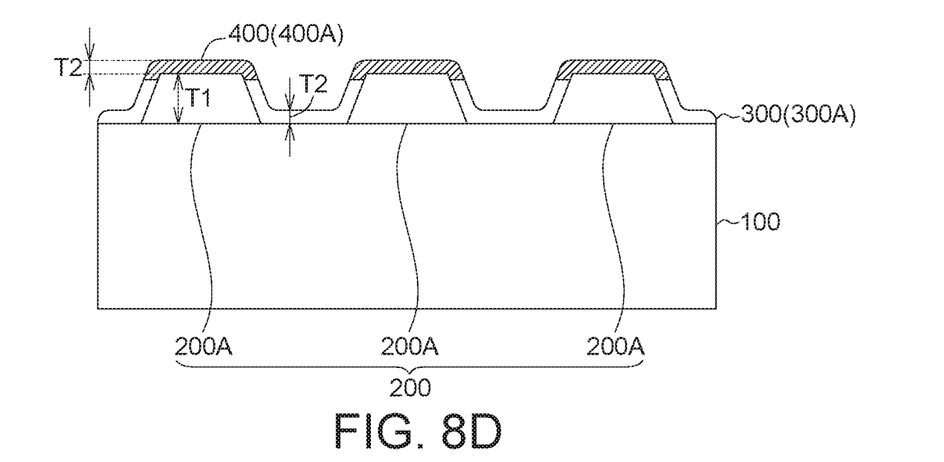

Then, as indicated in FIG. 8D, after the solid state reaction is performed, the first metal halide layer 300P is converted to a patterned photo-electric conversion layer 400 (that is, a plurality of photo-electric conversion blocks 400A) on the patterned electrode layer 200, wherein the patterned photo-electric conversion layer 400 includes a perovskite material. Moreover, in the same step, the part of the second metal halide layer 300A not reacted to form the perovskite material forms the pixel isolation structure 300.

Conventionally, when the light sensing layer is formed of silicon, the formation of the silicon light sensing layer requires a high temperature doping process (normally about 800° C.), and therefore the silicon light sensing layer cannot be directly formed in the pixel sensing circuit. Instead, the silicon light sensing layer needs to be formed separately, and then is thinned and bonded to the pixel sensing circuit. Thus, the overall manufacturing process involves complicated steps and higher cost. In contrast, the perovskite material of the patterned photo-electric conversion layer 400 according to an embodiment of the present disclosure is formed by a solid state reaction at a reaction temperature not over 140° C., and the process temperature of the pixel sensing circuit 110 is at least higher than 150° C. Therefore, the patterned photo-electric conversion layer 400 (perovskite material) can be directly formed on the pixel sensing circuit 110 by a solid state reaction of the present disclosure without damaging the pixel sensing circuit 110 if the temperature of heat treatment is too high. Thus, the steps of the manufacturing process are simplified and the manufacturing cost is reduced.

Moreover, since the perovskite material can be dissolved in the photo resist solution and the photo resist removal solution, the structure of the perovskite material may be easily damaged in the etching process, and the structural surface of the etched perovskite material layer will be uneven and will be disadvantageous to subsequent processes. Therefore, the photolithography etching process is not a suitable process for patterning the perovskite material layer. In contrast, according to an embodiment of the present disclosure, the photo-electric conversion blocks 400A forming the patterned photo-electric conversion layer 400 and the pixel isolation structure 300 separating the photo-electric conversion blocks 400A from one another can concurrently be formed by one single solid state reaction. Thus, the patterned photo-electric conversion layer 400 whose structural surface is planarized and has a predetermined pattern can be obtained without using several complicated processes.

In some embodiments as indicated in FIGS. 8B and 8D, the second thickness T2 of the metal halide layer including the first metal halide layer 300P and the second metal halide layer is smaller than the first thickness T1 of the patterned electrode layer 200, the pixel isolation structure 300 formed after the solid state reaction is completed and has a thickness (that is, the thickness 300T) substantially equivalent to the second thickness T2 of the metal halide layer but smaller than the first thickness T1 of the patterned electrode layer 200 (that is, the thickness 200T). Therefore, the first metal halide layer 300P having the second thickness T2 and disposed on the patterned electrode layer 200 can fully react with the organic halide material layer 300B. Moreover, the solid state reaction does not spread to the second metal halide layer 300A disposed in the recess between a plurality of top surfaces 200a of the patterned electrode layer 200. The photo-electric conversion blocks 400A forming the patterned photo-electric conversion layer 400 and the pixel isolation structure 300 separating the photo-electric conversion blocks 400A from one another can be efficiently formed by one single solid state reaction.

In some embodiments, the first thickness T1 of the patterned electrode layer 200 can be not smaller than the second thickness T2 of the metal halide layer as long as the first thickness T1 enables the top surface 200a of the patterned electrode layer 200 to be located higher than the surface of the substrate 100 and the first metal halide layer 300P can be formed on the top surface 200a to benefit the subsequent solid state reaction.

Figure 8E:
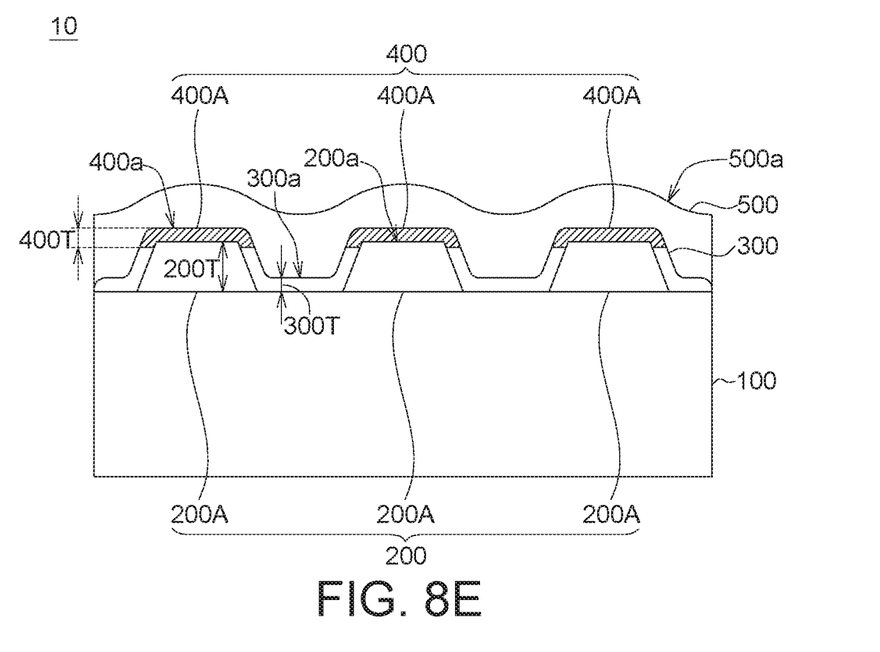

Then, as indicated in FIG. 8E, an electrode layer 500 is formed on the patterned photo-electric conversion layer 400 and the pixel isolation structure 300. At this point, the image sensor 10 of FIG. 1 is formed.

Refer to FIGS. 8A-8E and FIG. 4. In some other embodiments, through the control of the time and temperature of the solid state reaction, the first metal halide layer 300P having the second thickness T2 and disposed on the patterned electrode layer 200 does not fully react with the organic halide material layer 300B to form the patterned photo-electric conversion layer 400 but forms a metal halide film 310 on the patterned electrode layer 200 to form the image sensor 40 of FIG. 4.

Refer to FIGS. 8A-8E and FIG. 6. In the step as indicated in FIG. 8A, after the patterned electrode layer 200 is formed, the first buffer layer 600 can be optionally formed, and then the solid state reaction step as indicated in FIG. 8A-8D is performed to form the patterned photo-electric conversion layer 400. Then, in the step as indicated in FIG. 8E, the second buffer layer 700 can be optionally formed before the electrode layer 500 is formed on the second buffer layer 700. Furthermore, the planarization layer 810, the color filter layer 820 and/or the lens layer 830 are optionally formed in order to form the image sensor 60 of FIG. 6.

FIGS. 9A-9E are schematic diagrams of a manufacturing method of an image sensor according to another embodiment of the present disclosure. For elements of the present embodiments similar or identical to that of previous embodiment, similar or identical designations are used to indicate similar or identical elements. Relevant descriptions of similar or identical elements can be obtained from above disclosure.

Figure 9A:
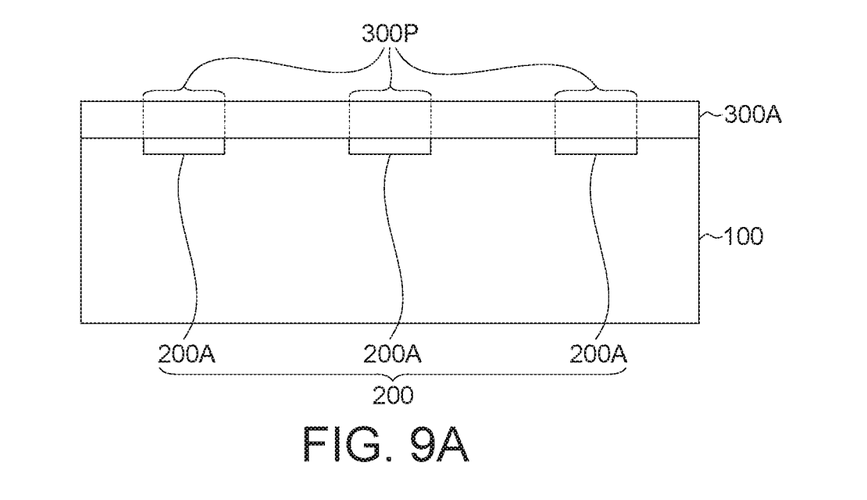
FIGS. 9A-9E are schematic diagrams of a manufacturing method of an image sensor according to another embodiment of the present disclosure.

Referring to FIG. 9A, a substrate 100 is provided, and a patterned electrode layer 200 is formed on the substrate 100, wherein the patterned electrode layer 200 includes a plurality of electrode blocks 200A separated from one another are embedded on the substrate 100.

Moreover as indicated in FIG. 9A, a metal halide layer is formed on the patterned electrode layer 200 and the substrate 100. In an embodiment, the metal halide layer includes a first metal halide layer 300P formed on the electrode blocks 200A and a second metal halide layer 300A formed on the substrate 100.

In an embodiment as indicated in FIG. 9A, the substrate 100 may include a pixel sensing circuit 110, wherein the step of providing the substrate 100 may further include manufacturing the pixel sensing circuit 110 whose process temperature is higher than 150° C. According to an embodiment of the present disclosure, the step of manufacturing the pixel sensing circuit 110 is performed before the subsequent step of forming the patterned photo-electric conversion layer by a solid state reaction is performed.

Figure 9B:
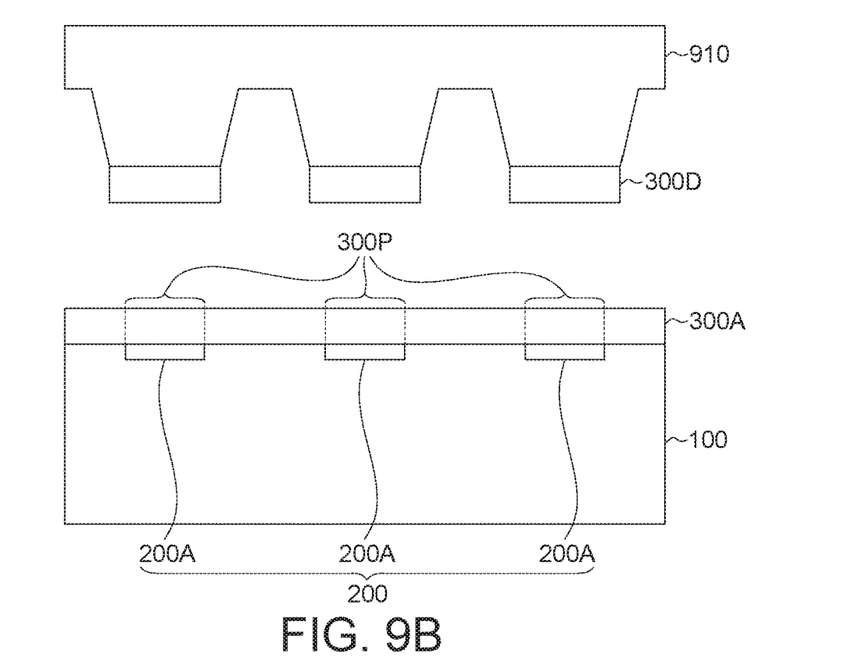

Then, as indicated in FIG. 9B, a patterned organic halide layer 300D is provided. In an embodiment as indicated in FIG. 9B, a mold 910 whose surface has a protruded pattern is provided. Then, an organic halide layer is formed on the surface of the mold 910, wherein the organic halide layer disposed on the protruded pattern of the mold 910 forms the patterned organic halide layer 300D.

In an embodiment as indicated in FIG. 9B, the organic halide layer is disposed only on the protruded pattern of the mold 910 to form the patterned organic halide layer 300D. In some other embodiments, the organic halide layer can be formed on the overall surface of the mold 910 (not illustrated in the diagram). The patterned organic halide layer 300D is similar to the metal halide layer including the first metal halide layer 300P and the second metal halide layer 300A according to an embodiment as indicated in FIG. 8A but the patterned organic halide layer 300D only denotes the part of the organic halide layer disposed on the protruded pattern of the mold 910.

Figure 9C:
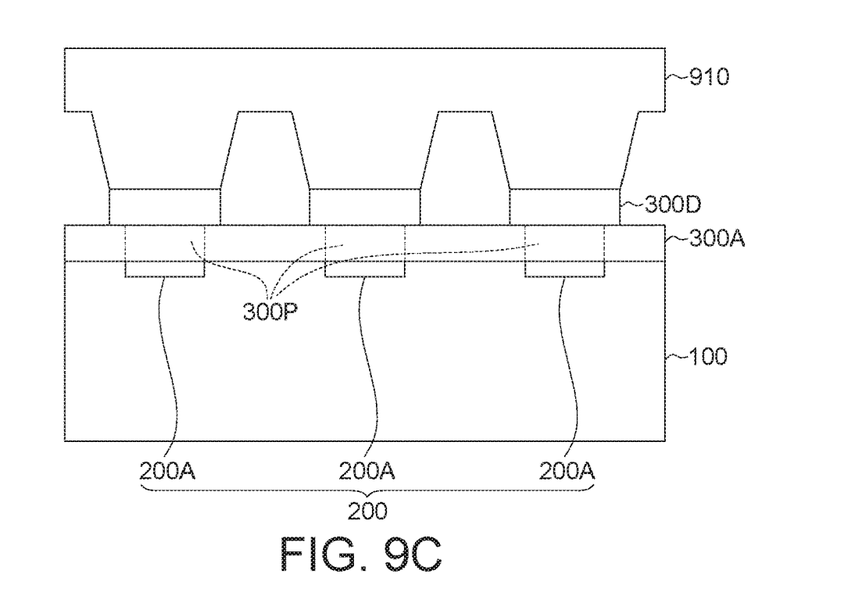

As indicated in FIG. 9C, the patterned organic halide layer 300D contacts the first metal halide layer 300P and performs a solid state reaction with the first metal halide layer 300P.

In some embodiments, the solid state reaction is performed at a heating temperature of 90-140° C. for a reaction time of 10-120 minutes. In some embodiments, the solid state reaction is performed at a heating temperature of 100-120° C. for a reaction time of 60-100 minutes. In some embodiments, the solid state reaction can be performed in the air or under vacuum.

Figure 9D:
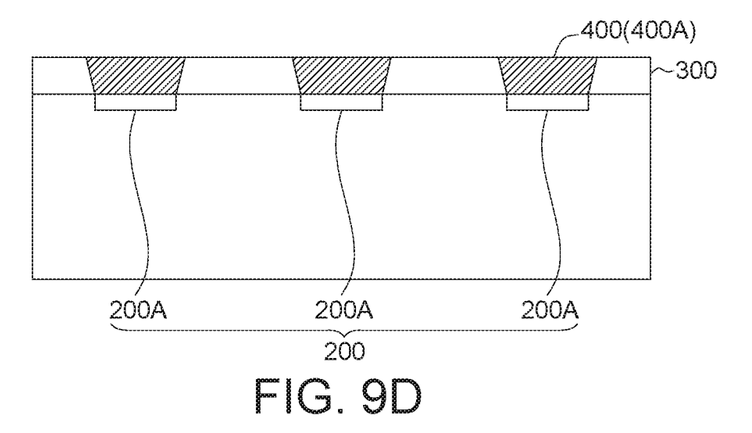

Then, as indicated in FIG. 9D, after the solid state reaction is performed, the first metal halide layer 300P is converted to a patterned photo-electric conversion layer 400 on the patterned electrode layer 200, wherein the patterned photo-electric conversion layer 400 includes a perovskite material. Moreover, in the same step, the part of the second metal halide layer 300A not reacted to form the perovskite material forms the pixel isolation structure 300.

Figure 9E:
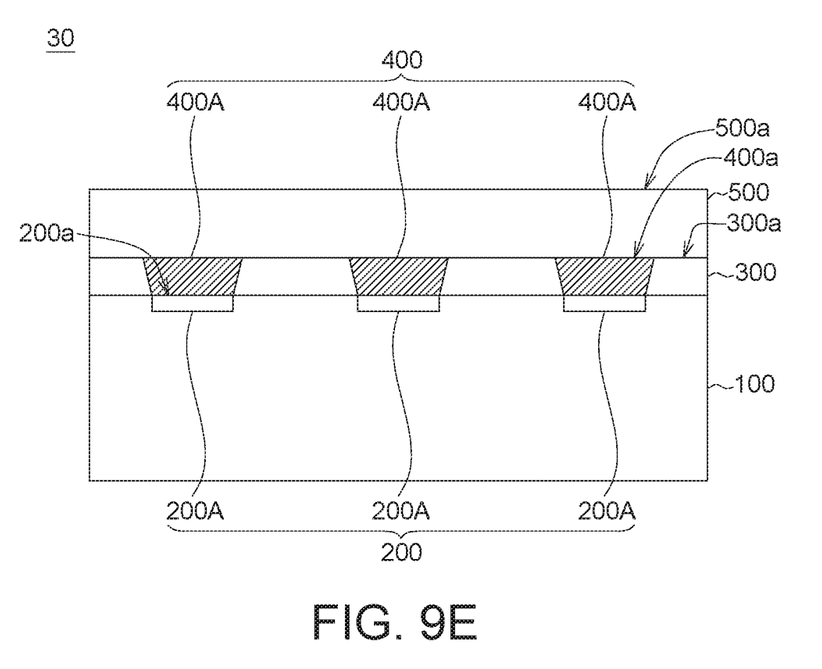

Then, as indicated in FIG. 9E, an electrode layer 500 is formed on the patterned photo-electric conversion layer 400 and the pixel isolation structure 300. At this point, the image sensor 30 of FIG. 3 is formed.

Refer to FIGS. 9A-9E and FIG. 5. In some other embodiments, through the control of the time and temperature of the solid state reaction, the first metal halide layer 300P disposed on the patterned electrode layer 200 is not fully reacted as the patterned photo-electric conversion layer 400 but forms a metal halide film 310 on the patterned electrode layer 200 to form the image sensor 50 of FIG. 5.

Refer to FIGS. 9A-9E and FIG. 7. In the step as indicated in FIG. 9A, after the patterned electrode layer 200 is formed, the first buffer layer 600 can be optionally formed, and then the solid state reaction step as indicated in FIG. 9A-8D is performed to form the patterned photo-electric conversion layer 400. Then, in the step as indicated in FIG. 9E, the second buffer layer 700 can be optionally formed before the electrode layer 500 is formed on the second buffer layer 700. Furthermore, the planarization layer 810, the color filter layer 820 and/or the lens layer 830 are optionally formed in order to form the image sensor 70 of FIG. 7.

The patterned photo-electric conversion layer of the present disclosure and the manufacturing method thereof are elaborated in a number of embodiments below. However, the embodiments below are for exemplary and explanatory purposes only, not for limiting the scope of protection of the embodiments of the present disclosure.

Embodiment 1

Figure 10:
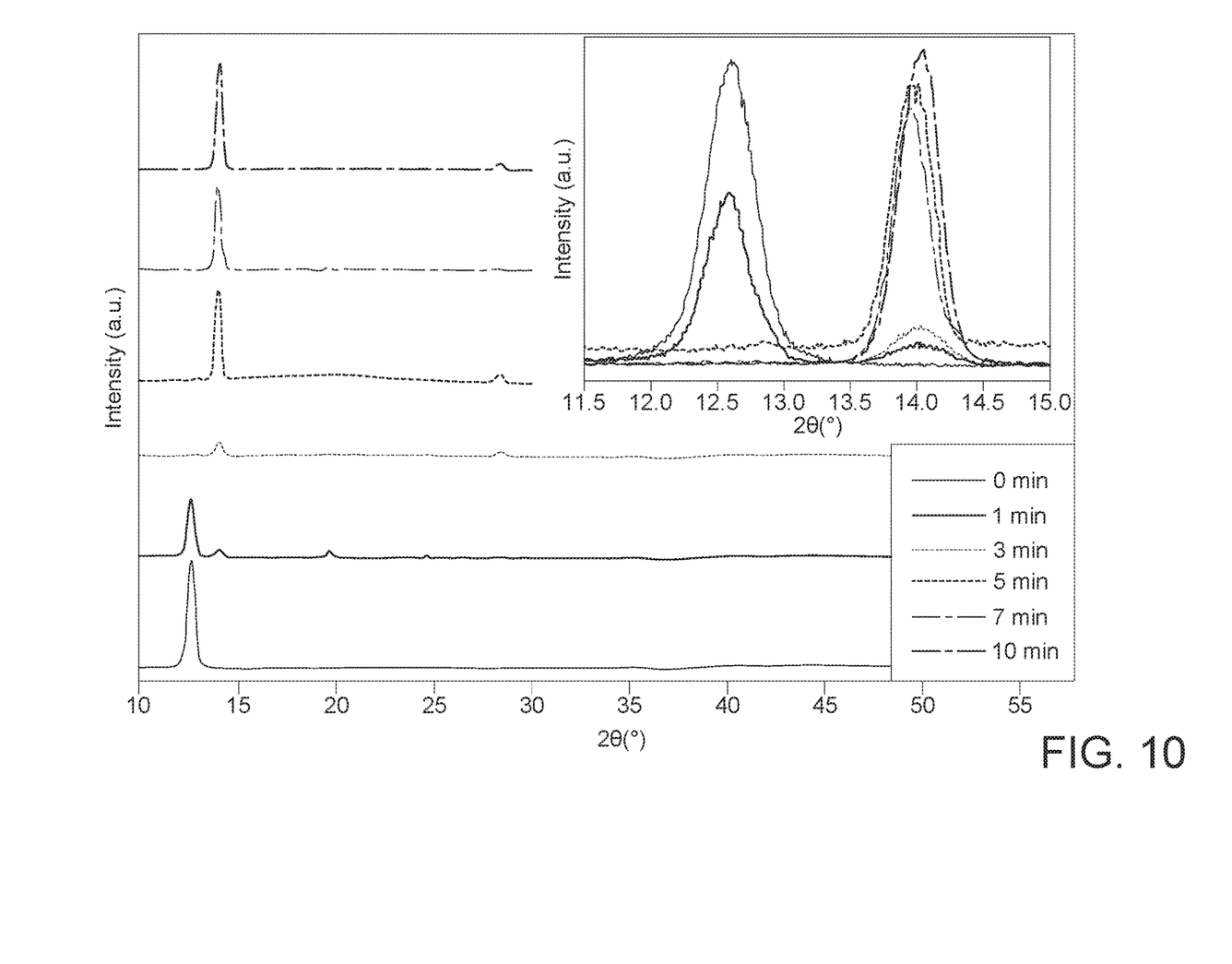
FIG. 10 is an X-ray diffraction (XRD) diagram of a patterned photo-electric conversion layer of an image sensor according to an embodiment of the present disclosure.

FIG. 10 is an X-ray diffraction (XRD) diagram of a patterned photo-electric conversion layer of an image sensor according to an embodiment of the present disclosure. In embodiment 1, the patterned photo-electric conversion layer is manufactured using the manufacturing process as indicated in FIGS. 8A-8D, the metal halide layer (the first metal halide layer 300P and the second metal halide layer 300A) is manufactured using metal halide, i.e. lead iodide ($PbI_2$), the organic halide layer 300B is manufactured using methyl ammonium iodide ($CH_3NH_3I$), and the patterned photo-electric conversion layer is formed of a material which is rich in perovskite material, i.e. methyl ammonium lead iodide ($CH_3NH_3PbI_3$). In embodiment 1, the solid state reaction is performed in the air at a reaction temperature of 120° C. FIG. 10 shows the X-ray diffraction of the patterned photo-electric conversion layer according to the present embodiment when the reaction time is 0 minute, 1 minutes, 3 minutes, 5 minutes, 7 minutes and 10 minutes respectively.

As indicated in FIG. 10, when the reaction time is 1 minute, the diffraction peak (12.5°) of lead iodide still can be clearly seen. When the reaction time is 3 minutes, the diffraction peak of lead iodide basically has disappeared, as the diffraction peak of methyl ammonium lead iodide (14°) appears. When the reaction time is longer than 5 minutes, the diffraction peak of methyl ammonium lead iodide can be clearly seen as the diffraction peak of lead iodide has fully disappeared. At this point, the solid state reaction is essentially complete, lead iodide is fully reacted, and the patterned photo-electric conversion layer which is rich in perovskite material, i.e. methyl ammonium lead iodide ($CH_3NH_3PbI_3$), is formed.

Embodiment 2

In embodiment 2, the patterned photo-electric conversion layer is manufactured using the manufacturing process as indicated in FIGS. 9A-9D, the metal halide layer is manufactured using metal halide, i.e. lead iodide ($PbI_2$), the patterned organic halide layer 300D is manufactured using methyl ammonium iodide ($CH_3NH_3I$), and the patterned photo-electric conversion layer is formed of a material which is rich in perovskite material, i.e. methyl ammonium lead iodide ($CH_3NH_3PbI_3$). In embodiment 2, the solid state reaction is performed in the air at a reaction temperature of 100° C. When the reaction time is 1 hour, methyl ammonium iodide is evaporated on the mold and has a thickness of 300 nm. After the patterned methyl ammonium iodide layer and the lead iodide layer on the mold are heat pressed and processed with the solid state reaction under the same conditions disclosed above, the patterned methyl ammonium iodide layer and the lead iodide layer form the patterned photo-electric conversion layer which is rich in perovskite material, i.e. methyl ammonium lead iodide ($CH_3NH_3PbI_3$).

While the invention has been described by way of example and in terms of the preferred embodiment(s), it is to be understood that the invention is not limited thereto. On the contrary, it is intended to cover various modification and similar arrangements and procedures, and the scope of the appended claims therefore should be accorded the broadest interpretation so as to encompass all such modification and similar arrangements and procedures.

What is claimed is:

1. An image sensor, comprising:
a substrate;
a patterned electrode layer disposed on the substrate and comprising a plurality of electrode blocks separated from one another;
a pixel isolation structure disposed on the substrate and comprising a metal halide; and
a patterned photo-electric conversion layer disposed on the plurality of electrode blocks to form a plurality of photo-electric conversion blocks corresponding to the plurality of electrode blocks, wherein the plurality of photo-electric conversion blocks comprise a perovskite material and are separated from one another by the pixel isolation structure, wherein a top surface of the patterned photo-electric conversion layer is located higher than a top surface of the pixel isolation structure;

wherein the perovskite material is represented by a formula as follows: $(AMX_3)_{1-n}(B_2MX_4)_n$, wherein "A" denotes a positive monovalent metal cation or a positive monovalent organic cation and "B" denotes an $R1-NH_3$ cation, wherein R1 is an alkyl group having 4-18 carbon atoms, "M" denotes a positive bivalent metal cation, "X" denotes a halogen, and n=0-1.

2. The image sensor according to claim 1, wherein the metal halide is represented by a formula as follows: $(MX_2)_a(AMX_3)_b(B_2MX_4)_c$, wherein "A" denotes a positive monovalent metal cation or a positive monovalent organic cation and "B" denotes an $R1-NH_3$ cation, wherein R1 is an alkyl group having 4-18 carbon atoms, "M" denotes a positive bivalent metal cation, "X" denotes a halogen, and a>b+c.

3. The image sensor according to claim 1, further comprising:
a metal halide film disposed on the plurality of photo-electric conversion blocks and interposed between the plurality of photo-electric conversion blocks and the plurality of electrode blocks, wherein the metal halide film has a thickness smaller than 10 nm.

4. The image sensor according to claim 1, further comprising:
a first buffer layer disposed on the patterned electrode layer, wherein the patterned photo-electric conversion layer is disposed on the first buffer layer;
a second buffer layer disposed on the patterned photo-electric conversion layer; and
an electrode layer disposed on the second buffer layer.

5. The image sensor according to claim 4, further comprising:
a planarization layer disposed on the electrode layer;
a color filter layer disposed on the planarization layer; and
a lens layer disposed on the color filter layer.

6. The image sensor according to claim 1, wherein the substrate comprises a pixel sensing circuit.

7. The image sensor according to claim 1, wherein the plurality of electrode blocks are embedded on the substrate.

8. The image sensor according to claim 1, wherein a top surface of the plurality of electrode blocks and a top surface of the substrate are coplanar.

* * * * *